March 26, 1963 R. C. SPRIESTERSBACH ETAL 3,083,304

TRANSISTORIZED FLIP-FLOP

Filed Aug. 3, 1959

Inventors:
Robert E. Bible
Ronald C. Spriestersbach
By Geo. Sievers
Attorney 3,083,304
TRANSISTORIZED FLIP-FLOP
Ronald C. Spriestersbach, Los Angeles, and Robert E. Bible, Burbank, Calif., assignors to General Precision, Inc., a corporation of Delaware
Filed Aug. 3, 1959, Ser. No. 831,277
8 Claims. (Cl. 307—88.5)

Figure 1:
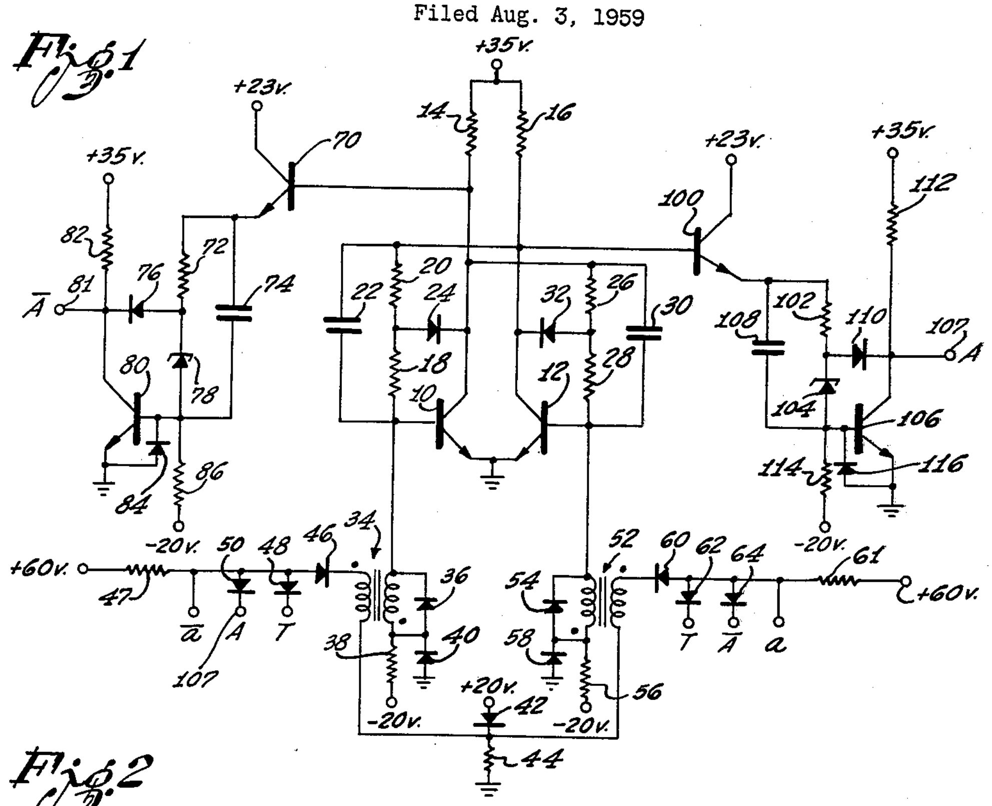

The present invention relates to transistorized bistable trigger networks of the type commonly referred to in the electronic art as "flip-flop" networks.

Flip-flops are widely used at present in electronic digital computers, and they are also used in many other types of electronic and electrical apparatus. Each flip-flop is provided with two output terminals. The flip-flop may be triggered to a first stable operating condition, generally referred to as a "true" state, in which a relatively high voltage is developed at a first output terminal and a relatively low voltage is developed at the second output terminal. The flip-flop may also be triggered to a second stable operating condition, generally referred to as a "false" state, in which the relatively high voltage is developed at the second output terminal and the relatively low voltage is developed at the first output terminal.

The triggering of the flip-flop from its true state to its false state is accomplished by the introduction of an appropriate input signal to a first of its two input terminals. The flip-flop will then remain in its false state until it is returned to its true state by the introduction of an input signal to the second of its two input terminals.

Certain problems have been encountered in the prior art when it has been attempted to transistorize the flip-flop network. These problems have been especially troublesome in the design of transistorized flip-flops for operation throughout a wide range of ambient temperatures. A first problem has been the tendency of transistors to saturate at relatively high temperatures. This has caused variations in the operating characteristics of the transistors, with resulting variations in the sensitivity and stability of the resulting transistorized flip-flop. A second problem has been the tendency of the flip-flop to become triggered by spurious signals such as noise.

The present invention, in one of its aspects, utilizes by-passing means, such as diodes, which operate when the current flow through the flip-flop transistors exceeds a particular threshold so as to limit such current flow to a particular maximum. The resulting circuitry of the invention is advantageous in that the diodes may be set to conduct when the corresponding transistors approach saturation. This causes the diodes to clamp the voltage at the collectors of the transistors above the saturation voltage.

The prevention of the transistors from becoming saturated causes the transistorized flip-flop of the present invention to have an increased sensitivity and stability throughout a wide range of operating temperatures. In addition, it permits the interchangeable use in the flip-flop circuitry of transistors having different gain characteristics and of different types.

It has been found that a wide range of transistors of the same type, and of different types, can be used in the circuit constituting this invention without changing the characteristics of the circuit to any noticeable extent. This latter feature is realized because the clamping diodes regulate the base currents of the corresponding transistors to nullify any gains in excess of a particular gain, this being achieved by the by-passing clamping action of the diode circuits.

Another feature of the invention is the inclusion of transformers in the input triggering circuits of the flip-flop network. A first transformer is included in the triggering circuit of one of the flip-flop transistors and a second transformer is included in the triggering input circuit for the second flip-flop transistor. The first transformer has current built up in its primary when its associated transistor is cut off, and the second transformer has current built up in its primary when its associated transistor is cut off. When a particular one of the transistors of the flip-flop is conductive, the current flow through its associated transformer primary is reduced to zero. The triggering input pulses serve to interrupt the current flow in the transformer primary having current in it so as to facilitate the triggering of the flip-flop from one state to another.

A flip-flop constructed in accordance with the teachings of the present invention cannot normally be triggered from one state to another until a sufficient amount of current has built up in the corresponding one of the transformer primaries. This provides for stability and immunity from noise, because the flip-flop can be designed to be relatively insensitive to any type of signal other than those occurring substantially at the repetition frequency of the triggering pulses. More specifically, the flip-flop network of the invention can be designed so that it is capable of being triggered only after an interval has elapsed corresponding substantially to the interval between triggering pulses.

The transformers in the triggering circuits of the transistorized flip-flop of the present invention are also advantageous, in that they provide a measure of delay between the occurrence of a triggering pulse and the actual triggering of the flip-flop from one state to another. This delay positively prevents any "ghost" triggering of the flip-flop as sometimes occurs in the prior art. Such ghost triggering causes the flip-flop to have a tendency to be triggered several times by a single triggering pulse.

Figure 2:
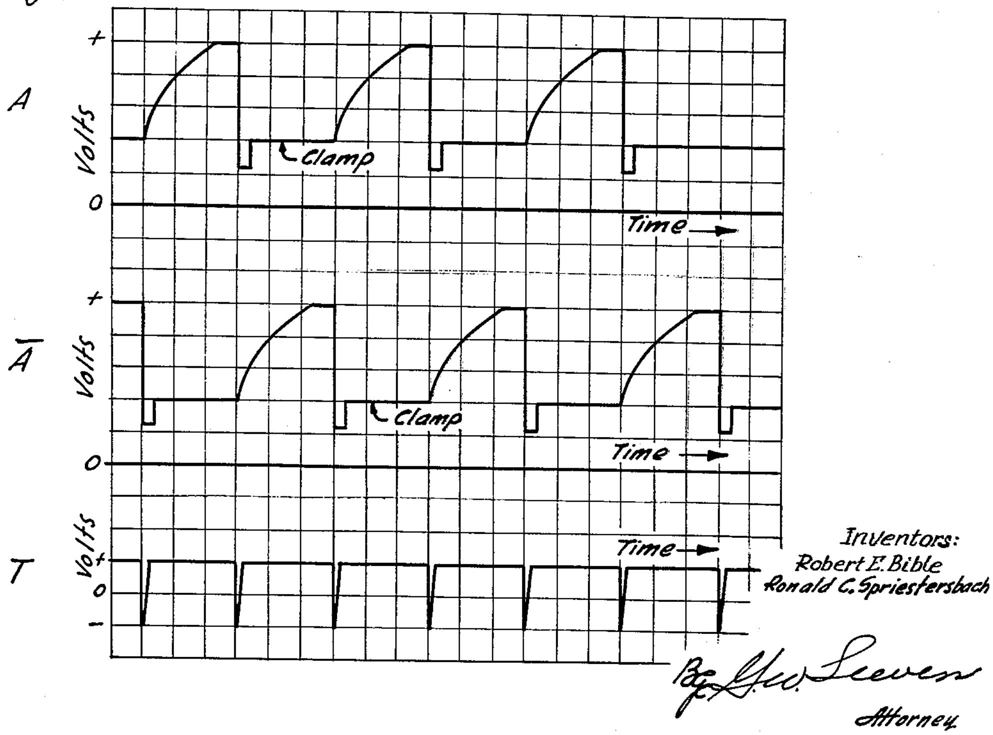

A more complete understanding of the invention will be obtained by a consideration of the accompanying drawing in which:

FIGURE 1 is a circuit diagram of an improved transistorized flip-flop circuit constructed in accordance with the present invention to incorporate transistors in its input triggering circuits, and further to incorporate diode clamping circuits for reasons to be described; and FIGURE 2 is a series of curves useful in explaining the operation of the flip-flop circuit of FIGURE 1.

The illustrated flip-flop circuit in FIGURE 1 includes a pair of discharge means such as transistors 10 and 12. These transistors may be of the N-P-N type, and they may be of the type presently designated as 2N337. The emitters of the transistors 10 and 12 may be connected to a point of reference potential, such as ground. The collector of the transistor 10 is connected to a resistor 14, and the collector of the transistor 12 is connected to a resistor 16. Each of the resistors 14 and 16 may have a resistance of 15 kilo-ohms, and both resistors are connected to a terminal which may provide a suitable positive potential such as +35 volts.

The base of the transistor 10 is connected to a resistor 18 which, in turn, is connected to a resistor 20. A capacitor 22 is shunted across these resistors, and the resistor 20 is connected to the collector of the transistor 12. The resistor 18 may have a resistance of 3 kilo-ohms, the resistor 20 may have a resistance of 15 kilo-ohms, and the capacitor 22 may have a capacity of 20 micro-microfarads.

A diode 24 has its anode connected to the junction of the resistors 18 and 20, and the cathode of the diode is connected to the collector of the transistor 10. In like manner, a pair of resistors 26 and 28 are connected in series between the collector of the transistor 10 and the base of the transistor 12. The resistor 26 may have a resistance of 15 kilo-ohms, and the resistor 28 may have a resistance of 3 kilo-ohms.

A capacitor 30 having a value of the order of 20 micro-microfarads is shunted across the resistors 26 and 28. A diode 32 has its anode connected to the junction of the resistors 26 and 28, and the cathode of the diode is connected to the collector of the transistor 12. The base of the transistor 10 is also connected to the secondary of a transformer 34. This transformer may have a turns ratio of 4:1. The secondary of the transformer is shunted by a diode 36, and the other terminal of the secondary is connected to a resistor 38. The resistor 38 may have a resistance of 36 kilo-ohms, and it is connected to a terminal receiving a suitable negative potential such as −20 volts from a voltage source. The second terminal of the secondary is also connected to the cathode of a diode 40, the anode of which is connected to receive a reference potential such as ground.

The primary of the transformer 34 has one terminal connected to the cathode of diode 42 and to one terminal of a resistor 44. The resistor 44 has its second terminal connected to receive the reference potential, and it may have a resistance of the order of 43 kilo-ohms. The anode of the diode 42 is connected to a terminal providing a suitable positive potential such as +20 volts. The other terminal of the primary is connected to the cathode of a diode 46. The anode of the diode 46 is connected to a resistor 47 which, in turn, is connected to a terminal receiving a suitable positive potential such as +60 volts from the voltage source.

The anode of the diode 46 is also connected to the anode of a diode 48 and to the anode of a diode 50. The anode of the diode 46 is also connected to an input terminal at which the input signal ($\bar{a}$) is introduced. The cathode of the diode 50 is connected to an input terminal which, in turn, is connected to the right output terminal of the flip-flop to derive the term (A). Likewise, the cathode of the diode 48 is connected to an input terminal which receives the clock pulses (T). The base of the transistor 12 is connected to the secondary of a transformer 52 and to the cathode of a diode 54, the diode being shunted across the secondary of the transformer 52.

The transformer 52 also may have a turns ratio of 4:1. The other terminal of the secondary of the transformer 52 is connected to a 36 kilo-ohm resistor 56 and to the cathode of a diode 58, the anode of the diode being connected to receive the reference potential. The primary of the transformer 52 is connected to the junction of the diode 42 and the resistor 44, the other terminal of the primary being connected to the cathode of a diode 60. The anode of the diode 60 is also connected to a resistor 61, this resistor being connected to the positive terminal of the 60 volt direct voltage source. The anode of the diode 60 is further connected to an input terminal which receives the input signal ($a$).

The anode of the diode 60 is also connected to the anode of a diode 62 and to the anode of a diode 64. The clock pulses (T) are introduced to the cathode of the diode 62, and the left output terminal of the flip-flop is connected to the cathode of the diode 64 to introduce the term ($\bar{A}$) to that cathode.

The collector of the transistor 10 is connected to the base of discharge means such as a transistor 70. The transistor 70 may also be of the N-P-N type, and it likewise may be of the type presently designated 2N337. The emitter of the transistor 70 is connected to a resistor 72 and to a capacitor 74, which may respectively have values of approximately 1.6 kilo-ohms and 150 micro-microfarads. The collector of the transistor 70, on the other hand, is connected to a terminal source receiving a suitable positive potential such as +23 volts from the voltage source.

The resistor 72 is connected to the anode of a diode 76 and to the cathode of a Zener diode 78. The cathode of the diode 76 is connected to the collector of discharge means such as an N-P-N medium power transistor 80. This medium power transistor may be of the type presently designated 2N343.

The emitter of the transistor 80 is connected to receive the reference potential, such as ground, and the collector of the transistor is connected to an output terminal 81 and to a load resistor 82. The load resistor may have a value of 20 kilo-ohms. The term ($\bar{A}$) is developed at the output terminal 81. The resistor 82 is connected to the 35-volt terminal. The base of the transistor 80 is connected to the cathode of a diode 84, to a resistor 86, and to the junction of the anode of the diode 78 and the capacitor 74. The resistor 86 may have a resistance of 43 kilo-ohms, and it is connected to the −20 volt terminal.

The collector of the transistor 12 is connected to the base of a discharge means such as a transistor 100. The collector of the transistor 100 is connected to the positive 23 volt direct voltage source. The transistor 100 may be of the N-P-N type, and may be of the type presently designated 2N337.

The emitter of the transistor 100 is connected to a resistor 102, which resistor may have a resistance of 1.6 kilo-ohms. The resistor 102 is connected to the cathode of a Zener diode 104, the anode of which is connected to the base of a discharge means such as a transistor 106. A capacitor 108 is shunted across the resistor 102 and the diode 104, and this capacitor may have a capacitance of 150 micro-microfarads.

The junction of the resistor 102 and the diode 104 is connected to the anode of a diode 110. The cathode of the diode 110 is connected to the collector of the transistor 106, to an output terminal designated 107, and to a load resistor 112, which may have a value of 20 kilo-ohms. The output term (A) is produced at the output terminal 107. The anode of the diode 104 is connected to a resistor 114, which may have a value of 43 kilo-ohms and which is connected to the negative 20 volt direct voltage source. The transistor 106 also is a medium power transistor, and it likewise may be an N-P-N transistor of the type presently designated 2N343. The base of the transistor 106 is connected to the cathode of a diode 116, the anode of the diode being connected to the reference potential such as ground.

The transistors 10 and 12 are connected to form the actual Eccles-Jordan flip-flop section of the circuit illustrated in FIGURE 1. The transistors 70 and 100 are included in emitter followers to provide isolation buffer stages. The transistors 80 and 106 are included in power amplifiers. The transformer trigger circuits and the clamping diode circuits, as mentioned previously, provide a high degree of sensitivity and stability for the flip-flop network throughout a wide range of ambient temperatures. These ambient temperatures may extend, for example, from −55° C. to +125° C.

Assume now that the output term (A) is at a high potential, and the output ($\bar{A}$) is at a low potential. During this condition, the transistors 12 and 80 are conductive, and the transistors 10 and 106 are non-conductive. This follows because, when the transistor 12 is rendered conductive, a relatively high current flows from the collector to the grounded emitter of the transistor through the resistor 16, reducing the collector potential of the transistor 12 substantially to ground potential. The potential on the base of the transistor 10 is negative at this time as a result of a current flow through the resistors 18 and 20, the secondary of the transformer 34 and the resistance 38 to the −20 v. terminal. The transistor 10 is, therefore, rendered non-conductive.

Since the base of the transistor 100 is connected to the collector of the transistor 12, the base of the transistor 100 has its potential reduced to a relatively low voltage during the time that the transistor 12 is conductive. Since the transistor 100 is included in an emitter follow stage, the potential on the emitter of the transistor follows the relatively low potential on the base of the transistor. This causes current to flow through a circuit including the +23 volt terminal, the collector and emitter of the transistor 100, the resistor 102, the Zener diode 104, the resistor 114 and the −20 volt terminal. This current flow in the emitter circuit of the transistor 100 causes the potential on the base of the power transistor 106 to become negative, so that the transistor 106 becomes non-conductive as stated above.

Conversely, because the transistor 10 is non-conductive, the base of the transistor 70 assumes a relatively high positive potential. The resultant current flow in the emitter circuit of the transistor 70 (through a circuit including the +23-volt terminal, the transistor, the resistor 72, the Zener diode 78, the resistor 86 and the −20 volt terminal) causes the base of the power transistor 80 to become positive, so that the power transistor 80 becomes conductive as stated above.

Therefore, as stated above, when the transistor 12 is conductive and the transistor 10 is non-conductive, the output terminal (A) at the collector of the transistor 106 is at a relatively high potential because that transistor is non-conductive. At the same time, the output terminal ($\bar{A}$) at the collector of the transistor 80 has a relatively low potential because the transistor 80 is conductive.

When the transistor 10 is non-conductive its base is established at a negative potential of, for example, −.7 volt. At the same time, the transistor 12 is conductive and its base is at a positive potential of, for example, +.7 volt. Now, during the interval that the transistor 10 is non-conductive, current flows through the primary winding of the transformer 34. This current flow is from the +60 volt positive source and through the diode 46 and through the resistor 4 to ground, the potential at the top of the resistor 44 being clamped to +20 volts by the diode 42. During this time, the term (A) is high so that the diode 50 is non-conductive.

Therefore, as soon as the flip-flop is triggered to the state in which the transistor 10 is non-conductive and the transistor 12 is conductive, current begins to build up in the primary of the transformer 34. No such current flows in the primary of the transformer 52, however, because the term ($\bar{A}$) is low. This causes the diode 64 to be conductive and current from the 60 volt positive source flows through that diode and the diode 60 is resultantly back-biased so that no current flows through it to the primary of the transformer 52.

As shown in the curve "T" of FIGURE 2, the clock pulses are negative going. However, between each clock pulse a positive voltage is introduced to the cathode of the diode 48 and to the cathode of the diode 62 of sufficient value to hold these diodes non-conductive.

Now the occurrence of the first negative going clock pulse after the build up of current in the primary of the transformer 34 serves to provide a by-passing path for the current from the 60 volt positive source through the diode 48. This causes the primary current in the transformer 34 to collapse to zero. This particular clock pulse has no effect, however, on the primary current in the transformer 52 because the current in that winding is already zero.

The collapse of the current through the primary of the transformer 34 causes a positive voltage to be induced across its secondary winding, the windings of the transformer 34 being appropriately poled to achieve that effect (as indicated by the dots adjacent the windings). This positive voltage is introduced to the base of the transistor 10. Then by Eccles-Jordan action, the flip-flop is triggered so that the transistor 12 becomes non-conducting and the transistor 10 becomes conductive. The conditions of the primary currents in the transformers 34 and 52 are now reversed, and the next clock pulse may return the flip-flop to its original condition.

When the transistor 10 becomes conductive and the transistor 12 becomes non-conductive, the potential on the output terminal (A) becomes relatively low (see FIGURE 2). This results from the fact that the non-conductivity of the transistor 12 causes the potential on the base and emitter of the transistor 100 in the emitter follower stage to swing to a relatively high value so as to produce a positive bias on the base of the medium power transistor 106. This positive bias on the base of the medium power transistor 106 causes that transistor to become conductive so that the output (A) assumes a relatively low potential.

Conversely, the conductivity of the transistor 10 causes the base and emitter of the transistor 70 in the emitter follower stage 70 to assume a relatively low potential, so that the bias on the base of the transistor 80 is negative. The transistor 80 is, therefore, rendered non-conductive and the output terminal ($\bar{A}$) is at a relatively high potential.

Therefore, when the flip-flop is in a condition in which the transistor 10 is non-conductive and the transistor 12 is conductive, as described above, current flows in the primary of the transformer 34 but no current flows in the primary of the transformer 52. Now, the occurrence of a clock pulse T may reduce the current in the primary of the transformer 34 to zero to trigger the flip-flop. The term (A) now goes low so that the diode 50 becomes conductive to hold the primary current of the transformer 34 at zero after the triggering clock pulse terminates. During this time, a current is building up in the primary of the transformer 52, as described.

Therefore, when the flip-flop is triggered from one condition to another, the current in the primary winding of one of the transformers 34 and 52 is reduced to zero, and a current is built up in the primary of the other of these transformers. The transformers are disposed to have inductive values so that only after an interval of time, substantially equal or slightly less than the interval between successive clock pulses (T), does sufficient current build up in a particular one of the two primary windings so as to permit triggering of the flip-flop from one of its stable operating conditions to the other. This prevents the operation of the flip-flop from being affected by noise which might otherwise cause the flip-flop to be triggered from one state of operation to the other on a spurious basis.

Successive ones of the clock pulses (T) in FIGURE 2, therefore, trigger the flip-flop from one stable operating condition to another. This causes the output terminals (A) and ($\bar{A}$) to have the configuration illustrated in FIGURE 2. It will be observed by an examination of the curve of FIGURE 2 that the output terminal (A) has a relatively high potential when the output terminal ($\bar{A}$) is at a relatively low potential, and vice versa.

The flip-flop cannot be triggered from one state to another until a sufficient amount of current has been built up in one or the other of the primaries of the transformers 34 and 52. This results from the operation of the inductive reactance in the transformer in preventing current from increasing in the transformer. This, as mentioned above, provides for stability and immunity from noise. As noted, the circuit is preferably designed so that it can be triggered only after an interval corresponding substantially to the interval between successive triggering pulses has elapsed. In a constructed embodiment of the invention, for example, a triggering power of less than 5 milliwatts was required. However, noise signals up to 10 volts failed to trigger the flip-flop.

As also noted above, the transformer triggering circuits are also advantageous in that they provide a measure of delay between the occurrence of a triggering pulse and the actual triggering of the flip-flop. This delay results from the inductive action of the transformers 34 and 52. The delay serves to prevent "ghost" triggering which is prevalent in many types of prior art flip-flops. "Ghost" triggering may be defined as that which occurs when a flip-flop is triggered more than once upon the introduction of each input signal.

The diodes 24 and 32 each serve a two-fold purpose. These diodes compensate for varying gains in respective ones of the transistors 10 and 12, and they also serve to prevent their corresponding transistors from entering their saturation regions.

For example, when the transistor 10 is rendered conductive, base current begins to flow in that transistor and the collector begins to draw collector current through the resistor 14 from the 35 volt direct current source. This causes the collector voltage to decrease. Should the collector voltage decrease below the threshold established by the potential divider action of the resistors 20 and 18, the diode 24 begins to conduct. This causes some of the current which would normally flow into the base of the transistor 10 to flow through the diode 24. Therefore, should the gain of the transistor 10 exceed a predetermined minimum, the base current in the transistor is reduced by the resulting conductivity of the diode 24. In this manner the circuit of the transistor 10 exhibits essentially constant gain characteristics, despite changes or variations in the gain of the transistor itself. The diode 32 controls the gain characteristics of the circuit of the transistor 12 in the same way.

The parameters of the circuits described in the preceding paragraph are so chosen that any transistor within a contemplated range of gains, and which may be used to constitute the transistor 10 or the transistor 12 will not be driven into its saturation region. The circuit constants are so chosen that when either the transistor 10 or the transistor 12 approaches saturation, its base current is reduced by the resulting conduction of the diode 24, or of the diode 32. The result of this is that the collector current of the transistors in the permissible range of gains is held below that which would produce saturation effects.

The diode clamping circuits described above for preventing the transistors 10 and 12 from becoming saturated cause the transistorized flip-flop of the invention to have an increased stability throughout a wide range of operating temperatures. In addition, the diode clamping circuitry also permits the interchangeable use of transistors in the flip-flop, even though the different transistors have different gain characteristics and are of different general types.

As noted above, it has been found that a wide range of transistors of the same type and of different types can be used in the flip-flop of the invention without changing the characteristics of the flip-flop circuit to any noticeable extent. This is realized because, as mentioned, it is merely necessary to design the flip-flop to the lowest contemplated transistor gains, and the diode clamping circuits automatically compensate for transistors with greater gains.

The diodes 76 and 110 serve the same purpose as the diodes 24 and 32, but with respect to the medium power transistors 80 and 106 respectively. The Zener diodes 78 and 104 are included to replace resistors, such as the resistors 18 and 28. The Zener diodes provide a constant clamping voltage of, for example, 12 volts, regardless of variations in the load exerted on the power transistors by the utilization means with which the flip-flop may be used. These latter diodes prevent the medium power transistors 80 and 116 from being driven to saturation throughout a wide range of operating temperatures and under widely fluctuating load conditions.

The diodes 84 and 116 are provided with a faster response time than the associated transistors 80 and 106. These latter diodes increase the response of the power amplifiers when the power amplifiers are respectively driven to states of non-conductivity. This is because the diodes 84 and 116 cause the base electrodes of the associated transistors 80 and 106 to swing rapidly negative as the voltage introduced across the input circuits of the transistors decreases below ground or reference potential.

A faster response time in the triggering of the flip-flop network from one state to another is also realized by the use of the capacitors 22, 30, 74 and 108. These capacitors provide the increased response by virtue of their charge-discharge action as the flip-flop is triggered from one state to another.

The curves (A) and ($\overline{A}$) in FIGURE 2 illustrate the manner in which the clamping diodes 24 and 32 limit the low potential portions of each of these curves to a value above a predetermined minimum. The short negative-going pulse illustrated in the curves following each transistion from a high to a low value is due to the slight lag in the response of the diode clamping circuits.

The diodes 36 and 40 prevent the formation of negative transient spikes which are capable of damaging the transistor 10. The diodes 54 and 48 perform the same service with respect to the transistor 12. For example, when the transistor 10 is first rendered non-conductive there is a tendency for its base electrode to swing negative in a transient condition. The secondary of the transformer 34 exhibits a high impedance to this rapidly increasing negative voltage. However, the diodes 36 and 40 present a low impedance path to ground for the transient voltage and limits the voltage to a value corresponding to the combined impedance of the two diodes. The transient voltage is so limited, for example, to about —1.2 volts. The diodes 36 and 40, therefore, serve to protect the transistor 10 during transient conditions.

The diode 40, on the other hand, determines how far negative the base of the transistor 10 can go during a steady direct current state when the transistor 10 is non-conductive. During this state, the secondary of the transformer 34 presents negligible impedance to the direct current. The diode 40 now limits the base voltage to about —.6 volt, for example.

The diode 40 also serves as a compensating means for any leakage currents in the transistor 10, and the diode 58 performs a similar function for the transistor 12. For example, when the transistor 10 is non-conductive, should a leakage current flow from the collector of the transistor 10 to its base, such leakage would normally affect the base voltage with resulting deleterious effects on the stability of the flip-flop circuit. However, in the circuit of FIGURE 1, if such a leakage current were to flow the current through diode 40 will correspondingly decrease so that the current through resistor 38 will remain constant, and the base voltage accordingly will remain constant.

The invention provides, therefore, an improved transistorized flip-flop network which exhibits a high degree of noise immunity, this being due to the inclusion of unique reactance circuits such as transformer networks in the input triggering circuits. The transformer networks operate in the described manner to achieve this purpose. The improved flip-flop of the invention also incorporates the described diode clamping circuits which render the flip-flop capable of stable and sensitive operation throughout a wide range of operating temperatures. These diode clamping circuits, as described, also render the flip-flop network capable of interchangeably using different transistors without any appreciable change in its triggering or output characteristics.

We claim:

1. A flip-flop network having a first stable operating condition and a second stable operating condition, said network including: first electronic discharge means having input and output electrodes, second electronic discharge means having input and output electrodes, first and second output circuits respectively coupled to the output electrodes of said first and second discharge means for producing complementary output signals indicative of the operating condition of the flip-flop network, electrical circuitry coupling the input electrode of each of said discharge means to the output electrode of the other of said discharge means to provide a first stable operating condition upon a state of conductivity of said first discharge means and a state of non-conductivity of said second discharge means and to provide a second stable operating condition upon a state of conductivity of said second discharge means and a state of non-conductivity of said first discharge means, first and second inductance means each coupled to the input electrode of an individual one of the discharge means to produce a flow of current through the corresponding discharge means upon an interruption of the energy stored in the particular inductance means and to prevent any further change in the conductivity of the corresponding discharge means until the restorage of energy in the particular inductance means, first and second circuit means respectively coupled to said first and second inductance means and to said first and second output circuits for producing a storage of energy in a particular one of said inductance means as controlled by said complementary output signals and means coupled to said first and second circuit means for introducing input signals to the inductance means to interrupt the storage of energy in the inductance means and for introducing such input signals to the inductance means at time intervals at least as long as that required to obtain the restorage of energy therein by said first and second circuit means.

2. The flip-flop network set forth in claim 1 in which electrical clamping circuitry couples the input and output electrodes of each of said discharge means to limit the value of the current flowing through the discharge means within particular limits.

3. A flip-flop network having a first stable operating condition and a second stable operating condition, said network including: a first transistor including a base electrode and a collector electrode, a second transistor including a base electrode and a collector electrode, first and second output circuits respectively coupled to the collector electrodes of said first and second transistors and producing complementary output signals indicative of the operating condition of the flip-flop network, electrical circuitry coupling the base electrode of each of said transistors to the collector electrode of the other of said transistors to provide the first stable operating condition upon a state of conductivity of said first transistor and a state of non-conductivity of said second transistor and to provide the second stable operating condition upon a state of conductivity of said second transistor and a state of non-conductivity of said first transistor, first and second inductance means each coupled to the base electrode of an individual one of the transistors to produce a flow of current through the corresponding transistor upon an interruption in the energy stored in the particular inductance means and to prevent any further change in the conductivity of the corresponding transistor until the restorage of energy in the particular inductance means, first and second circuit means respectively coupled to said first and second inductance means and to said first and second output circuits for producing a storage of energy in a particular one of said inductance means as determined by said complementary output signals, and means coupled to said first and second circuit means for introducing input signals to the inductance means to interrupt the storage of energy in the inductance means and for introducing such input signals to the inductance means at time intervals at least as long as that required to obtain the restorage of energy therein by said first and second circuit means.

4. The flip-flop network set forth in claim 3 in which electrical clamping circuitry is coupled to the base and to the collector of each of the first and second transistors to maintain the current through the transistors within particular limits.

5. A flip-flop network having a first stable operating condition and a second stable operating condition, said network including: first electronic discharge means having input and output electrodes, second electronic discharge means having input and output electrodes, first and second output circuits respectively coupled to the output electrodes of said first and second discharge means and producing complementary output signals indicative of the operating condition of the flip-flop network, electrical circuitry coupling the input electrode of each of said discharge means to the output electrode of the other of said discharge means to provide the first stable operating condition upon a state of conductivity of said first discharge means and a state of non-conductivity of said second discharge means and to provide the second stable operating condition upon a state of conductivity of said second discharge means and a state of non-conductivity of said first discharge means, first and second transformers each having a primary winding and a secondary winding, and each secondary winding being coupled to the input electrode of an individual one of the discharge means to produce a flow of current through the corresponding discharge means upon an interruption in the energy stored in the primary winding of the particular transformer and to prevent any further change in the conductivity of the corresponding discharge means until the restorage of energy in the primary winding of the particular transformer, first and second circuit means respectively coupled to the primary windings of said first and second transformers and to said first and second output circuits for producing a storage of energy in the primary winding of a particular one of said transformers as determined by said complementary output signals, and means coupled to said first and second circuit means for introducing input signals to the primary windings of said transformers to interrupt the storage of energy in the primary windings and for introducing such input signals to the primary windings at time intervals at least as long as that required to obtain the restorage of energy therein by said circuit means.

6. The combination defined in claim 5 and which includes clamping circuit means intercoupled between the input and output electrodes of at least one of said discharge means to limit the flow of current therethrough within particular limits.

7. A flip-flop network having a first stable operating condition and a second stable operating condition, said network including: a first transistor including a base electrode and a collector electrode, a second transistor including a base electrode and a collector electrode, first and second output circuits respectively coupled to the collector electrodes of said first and second transistors and producing complementary output signals indicative of the operating condition of the flip-flop network, electrical circuitry coupling the base electrode of each of said transistors to the collector electrode of the other of said transistors to provide the first stable operating condition upon a state of conductivity of said first transistor and a state of non-conductivity of said second transistor and to provide the second stable operating condition upon a state of conductivity of said second transistor and a state of non-conductivity of said first transistor, first and second transformers each having a primary winding and a secondary winding, the secondary winding of each of said transformers being coupled to the base electrode of an individual one of said transistors to produce a flow of current through the corresponding transistor upon an interruption in the energy stored in the primary winding of the particular transformer and to prevent any further change in the conductivity of the corresponding transistor until the restorage of energy in the primary winding of the particular transformer, first and second circuit means respectively coupled to the primary windings of said first and second transformers and to said first and second output circuits for producing a storage of energy in the primary winding of a particular one of said transformers as determined by said complementary output signals, and means coupled to said first and second circuit means for introducing input signals to the primary windings of said transformers to interrupt the storage of energy in said primary windings and for introducing such input signals to the primary windings at time intervals at least as long as that required to obtain the restorage of energy therein by said circuit means.

8. The combination defined in claim 7 and which includes a first clamping circuit including a diode coupled between the collector and base electrodes of the first transistor to limit the current flow therein to a particular value, and a second clamping circuit including a diode coupled between the collector and base electrodes of the second transistor to limit the current flow therein to a particular value.

References Cited in the file of this patent

UNITED STATES PATENTS

| | | |
|---|---|---|
| 2,759,104 | Skellett | Aug. 14, 1956 |
| 2,778,978 | Drew | Sept. 19, 1957 |
| 2,884,544 | Warnock | Apr. 28, 1959 |
| 2,898,479 | McElroy | Aug. 4 ,1959 |
| 2,909,680 | Moore et al. | Oct. 20, 1959 |